US010910349B2

(12) United States Patent
Lee

(10) Patent No.: US 10,910,349 B2
(45) Date of Patent: *Feb. 2, 2021

(54) STACKED SEMICONDUCTOR CHIPS HAVING TRANSISTOR IN A BOUNDARY REGION

(71) Applicant: SAMSUNG ELECTRONICS CO., LTD., Suwon-si (KR)

(72) Inventor: Sang Eun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/694,316

(22) Filed: Nov. 25, 2019

(65) Prior Publication Data
US 2020/0091117 A1 Mar. 19, 2020

Related U.S. Application Data

(63) Continuation of application No. 15/798,745, filed on Oct. 31, 2017, now Pat. No. 10,490,530.

(30) Foreign Application Priority Data

May 17, 2017 (KR) .................. 10-2017-0061143

(51) Int. Cl.
*H01L 23/48* (2006.01)
*H01L 21/00* (2006.01)
(Continued)

(52) U.S. Cl.
CPC .......... *H01L 25/0657* (2013.01); *H01L 22/12* (2013.01); *H01L 23/49838* (2013.01);
(Continued)

(58) Field of Classification Search
CPC ................ H01L 25/0657; H01L 22/12; H01L 23/49838; H01L 23/528; H01L 25/50;
(Continued)

(56) References Cited

U.S. PATENT DOCUMENTS 7,032,194 B1 4/2006 Hsueh et al.
7,352,067 B2 4/2008 Fukaishi et al.
7,679,198 B2 3/2010 Anderson et al.
7,808,075 B1 10/2010 Cheng et al.
(Continued)

FOREIGN PATENT DOCUMENTS

JP 2008-218881 A 9/2008

*Primary Examiner* — Alonzo Chambliss
(74) *Attorney, Agent, or Firm* — Sughrue Mion, PLLC

(57) ABSTRACT

A semiconductor package and a method for fabricating the same are provided. The semiconductor package includes a first semiconductor chip which includes a first region, a second region, and a boundary region between the first region and the second region; and a second semiconductor chip disposed on the first semiconductor chip, wherein the second semiconductor chip is overlapping the first region and a part of the boundary region, and not overlapping the second region, wherein a first circuit element is disposed in the first region and a second circuit element is disposed in the boundary region, and wherein second circuit element stress tolerance is greater than first circuit element stress tolerance.

20 Claims, 15 Drawing Sheets

(51) Int. Cl.
*H01L 25/065* (2006.01)
*H01L 25/00* (2006.01)
*H01L 21/66* (2006.01)
*H01L 23/528* (2006.01)
*H01L 23/498* (2006.01)
*H01L 23/00* (2006.01)

(52) U.S. Cl.
CPC ............ *H01L 23/528* (2013.01); *H01L 25/50* (2013.01); *H01L 22/14* (2013.01); *H01L 23/562* (2013.01); *H01L 2225/0651* (2013.01); *H01L 2225/06506* (2013.01); *H01L 2225/06555* (2013.01); *H01L 2225/06562* (2013.01); *H01L 2225/06586* (2013.01)

(58) Field of Classification Search
CPC ........... H01L 23/562; H01L 2225/0651; H01L 2225/06555
See application file for complete search history.

(56) References Cited

U.S. PATENT DOCUMENTS

| | | | |
|---|---|---|---|
| 7,868,359 | B2 | 1/2011 | Takahashi |
| 7,883,947 | B1 | 2/2011 | Cheng et al. |
| 7,968,916 | B2 | 6/2011 | Anderson et al. |
| 8,362,622 | B2 | 1/2013 | Sproch et al. |
| 8,776,005 | B1 | 7/2014 | Xu et al. |
| 8,970,046 | B2 | 3/2015 | Kim et al. |
| 9,208,827 | B2 | 12/2015 | Lee et al. |
| 9,299,797 | B2 | 3/2016 | Takahashi et al. |
| 9,465,897 | B2 | 10/2016 | Moroz et al. |
| 10,490,530 | B2 * | 11/2019 | Lee ............... H01L 25/50 |
| 2005/0116331 | A1 | 6/2005 | Tsunozaki |
| 2006/0043500 | A1 | 3/2006 | Chen et al. |
| 2006/0267173 | A1 | 11/2006 | Takiar et al. |
| 2008/0150157 | A1 | 6/2008 | Nishimura et al. |
| 2008/0303131 | A1 | 12/2008 | McElrea et al. |
| 2009/0057870 | A1 | 3/2009 | Chung |
| 2012/0012844 | A1 | 1/2012 | Lee |
| 2015/0332992 | A1 | 11/2015 | Im et al. |
| 2016/0086921 | A1 | 3/2016 | Cho |

* cited by examiner

STACKED SEMICONDUCTOR CHIPS HAVING TRANSISTOR IN A BOUNDARY REGION

This application a Continuation application of U.S. application Ser. No. 15/798,745 filed on Oct. 31, 2017 in the U.S. Patent and Trademark Office, which claims priority from Korean Patent Application No. 10-2017-0061143 filed on May 17, 2017 in the Korean Intellectual Property Office, the disclosures of which are incorporated herein by reference in their entireties.

BACKGROUND

1. Field

Methods and apparatuses consistent with example embodiments relate to a semiconductor package and a method for fabricating the same. Specifically, exemplary embodiments relate to a semiconductor package in which a plurality of semiconductor chips is laminated and a method for fabricating the same.

2. Related Art

In recent years, in accordance with the development of the semiconductor industry and the needs of users, electronic devices have been further reduced in size and weight, and semiconductor elements, as essential components of electronic devices, also have been reduced in size and weight. As a result, a technique of combining multiple semiconductor elements into a single product has been developed. In order to combine semiconductor elements as a single product, a multi-chip package (MCP), which including a plurality of semiconductor chips, is fabricated.

Due to the laminated structure of the semiconductor chip, a thickness of the multi-chip package is increased. To compensate for the thickness of the multi-chip package, the thickness of the semiconductor chip is reduced. However, a thin semiconductor chip may cause various problems. For example, because a thin semiconductor chip is vulnerable to stress applied from the outside, and characteristics of a circuit element in the semiconductor chip may easily change.

SUMMARY

Exemplary embodiments provide a semiconductor package in which a change in characteristics of a circuit element in a semiconductor chip is minimized to improve the performance.

Exemplary embodiments also provide a method for fabricating a semiconductor package in which a change in characteristics of a circuit element in a semiconductor chip is minimized to improve the performance.

Example embodiments may address at least the above problems and/or disadvantages and other disadvantages not described above. Also, example embodiments are not required to overcome the disadvantages described above, and may not overcome any of the problems described above.

According to an aspect of an example embodiment, there is provided a semiconductor package including: a first semiconductor chip which includes a first region, a second region, and a boundary region between the first region and the second region; and a second semiconductor chip disposed on the first semiconductor chip, wherein the second semiconductor chip is overlapping the first region and a part of the boundary region, and not overlapping the second region, wherein a first circuit element is disposed in the first region and a second circuit element is disposed in the boundary region, and wherein second circuit element stress tolerance is greater than first circuit element stress tolerance.

According to an aspect of another example embodiment, there is provided a semiconductor package including: a first semiconductor chip which includes a first region, a second region, and a boundary region between the first region and the second region; and a second semiconductor chip disposed on the first semiconductor chip, wherein the second semiconductor chip is overlapping the first region and a part of the boundary region, and not overlapping the second region, wherein one side surface of the second semiconductor chip on the boundary region extends along a first direction, wherein a first transistor is disposed in the boundary region, and wherein sources and drains of the first transistor are aligned along a second direction that intersects the first direction.

According to an aspect of yet another example embodiment, there is provided a method for fabricating a semiconductor package, the method including: providing a first semiconductor chip including a first region, a second region, and a boundary region located between the first region and the second region; forming a first circuit element in the first region; forming a second circuit element in the boundary region, a second circuit element stress tolerance being greater than a first circuit element stress tolerance; and stacking a second semiconductor chip on the first semiconductor chip, the second semiconductor chip overlapping the first region and a part of the boundary region, and not overlapping the second region.

BRIEF DESCRIPTION OF THE DRAWINGS

The above and other aspects and features will become more apparent by describing in detail example embodiments thereof with reference to the attached drawings, in which.

DETAILED DESCRIPTION

Hereinafter, a semiconductor package according to one or more example embodiments will be described with reference to FIGS. 1 to 5.

Figure 1:
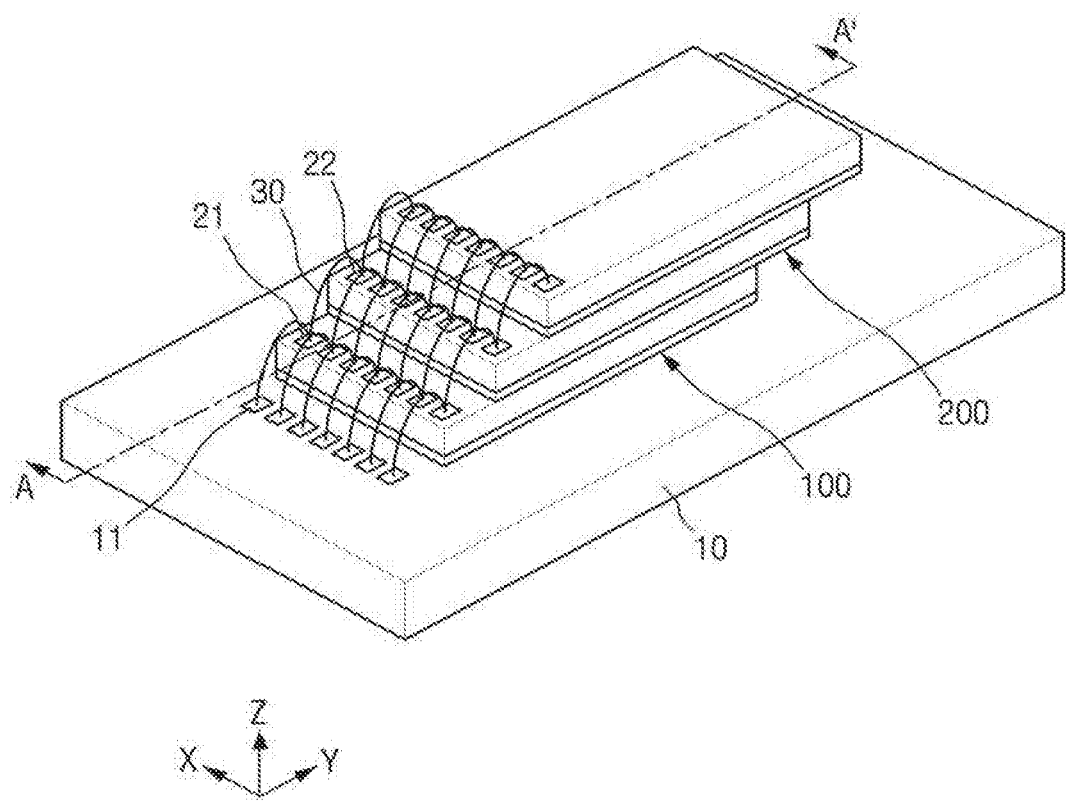
FIG. 1 is a perspective view of a semiconductor package according to one or more example embodiments.
Figure 2:
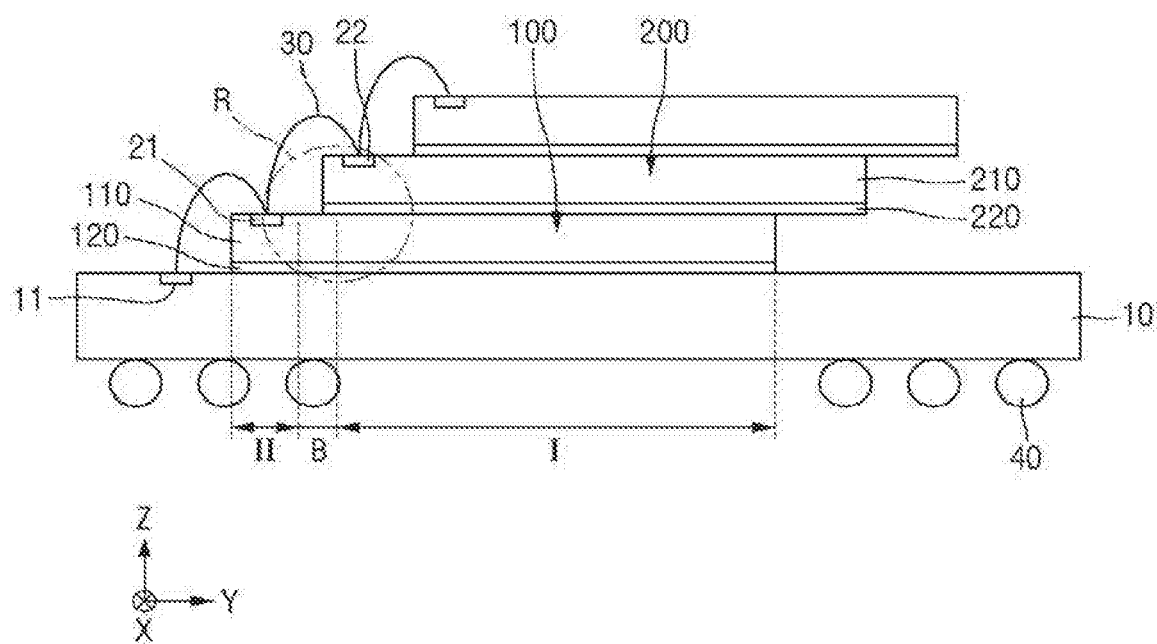
FIG. 2 is a cross-sectional view taken along a line A-A' of FIG. 1.
Figure 3:
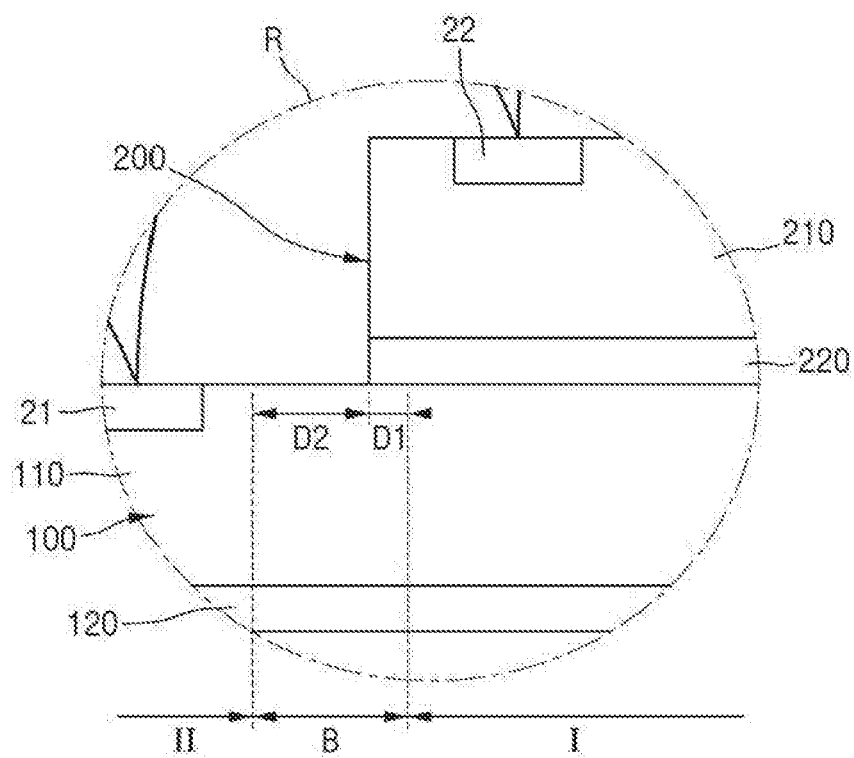
FIG. 3 is an enlarged view of a region R of FIG. 2.

FIG. 1 is a perspective view of a semiconductor package according to one or more example embodiments. FIG. 2 is a cross-sectional view taken along a line A-A' of FIG. 1. FIG. 3 is an enlarged view of a region R of FIG. 2.

Referring to FIGS. 1 to 3, a semiconductor package according to one or more example embodiments includes a substrate 10, a solder ball 40, a first semiconductor chip 100, a second semiconductor chip 200 and a bonding wire 30.

The substrate 10 may be a packaging substrate. For example, the substrate 10 may be a printed circuit board (PCB), or a ceramic substrate. The substrate 10 may be provided as a single layer or multiple layers. In addition, the substrate 10 includes upper and lower surfaces facing each other.

The substrate 10 may include a plurality of bonding pads 11. The plurality of bonding pads 11 may be disposed on an upper surface of the substrate 10. The bonding pad 11 of the substrate 10 may electrically connect the substrate 10 and the semiconductor chips 100 and 200 mounted on the substrate 10. That is, the bonding pad 11 may be formed of a conductor. Further, the bonding pad 11 may be connected to an electrical circuit formed on the substrate 10, such as a wiring pattern. That is, the bonding pad 11 may be a portion through which such a wiring pattern is connected to the outside. Further, as illustrated in FIG. 1, the plurality of bonding pads 11 may be arranged side by side along a first direction X.

Although FIGS. 1 and 2 illustrate a configuration in which three semiconductor chips are laminated on the substrate 10, this is only for convenience of explanation, and example embodiments are not limited thereto.

The solder balls 40 may contact the substrate 10. For example, the solder balls 40 may come into contact with the lower surface of the substrate 10. Further, the solder ball 40 may be connected to an electrical circuit formed below the substrate 10, for example, a wiring pattern or the like. That is, the solder ball 40 may be a portion through which such a wiring pattern is connected to the outside.

The first semiconductor chip 100 may be disposed on the substrate 10. For example, as illustrated, the first semiconductor chip 100 may be mounted directly on the upper surface of the substrate 10. In addition, when a lamination of a plurality of semiconductor chips is defined as a single chip stack, the first semiconductor chip 100 may include a plurality of chip stacks.

The first semiconductor chip 100 may include a plurality of first chip pads 21. The plurality of first chip pads 21 may be disposed on the upper surface of the first semiconductor chip 100. The first chip pad 21 may electrically connect the first semiconductor chip 100 with the substrate 10 or the first semiconductor chip 100 with another semiconductor chip. That is, the first chip pad 21 may be formed of a conductor. Further, the first chip pad 21 may be connected to a circuit element or the like included in the first semiconductor chip 100. That is, the first chip pad 21 may be a portion through which these circuit elements are connected to the outside. As illustrated in FIG. 1, a plurality of first chip pads 21 may be aligned side by side at the edge of the first semiconductor chip 100 along the first direction X.

As illustrated in FIGS. 1 to 3, the first chip pad 21 may be connected to the bonding pad 11 of the substrate 10 or the chip pad of another semiconductor chip by a bonding wire 30 or the like. However, example embodiments are not limited thereto, and the first chip pad 21 may be bonded to the bonding pad 11 of the substrate 10 or the chip pad of another semiconductor chip.

The first semiconductor chip 100 may include a first element region 110 and a first attachment region 120. As illustrated in FIG. 2, the first device region 110 may be an upper portion of the first semiconductor chip 100, and the first attachment region 120 may be a lower portion of the first semiconductor chip 100.

The first element region 110 is a region in which various circuit elements of the first semiconductor chip 100 are disposed. The first element region 110 may include a first region I, a second region II, and a boundary region B. The boundary region B is a region disposed below one side surface of a second semiconductor chip 200 to be described later. That is, one side surface of the second semiconductor chip 200 may be disposed on the boundary region B. Further, the first region I is a region which is adjacent to the boundary region B and overlaps the second semiconductor chip 200, and the second region II is a region which is adjacent to the boundary region B and does not overlap the second semiconductor chip 200. The first region I, the second region II, and the boundary region B will be described later in detail with reference to FIGS. 3 and 4.

The first attachment region 120 may be a region in which the first semiconductor chip 100 is mounted on the substrate 10 or another semiconductor chip. Specifically, the first attachment region 120 may mount the first semiconductor chip 100 on the substrate 10 or another semiconductor chip, using adhesive means. For example, the first attachment region 120 may include liquid epoxy, adhesive tape, or conductive medium, but example embodiments are not limited thereto.

The second semiconductor chip 200 may be laminated on the first semiconductor chip 100. For example, the second semiconductor chip 200 may be laminated on the first semiconductor chip 100, while forming an overhang region in the first semiconductor chip 100. For example, the laminated first semiconductor chip 100 and second semiconductor chip 200 may be arranged in a stair pattern. Thus, the second semiconductor chip 200 may expose a part of the first semiconductor chip 100, and an exposed part of the first semiconductor chip 100 may have a shape that protrudes from one side wall of the second semiconductor chip 200. Also, when a lamination of a plurality of semiconductor chips is defined as a single chip stack, the second semiconductor chip 200 may include a plurality of chip stacks.

More specifically, the second semiconductor chip 200 may be disposed on the first semiconductor chip 100 so that the second semiconductor chip 200 overlaps the first region I and does not overlap the second region II on the first semiconductor chip 100. One side surface of the second semiconductor chip 200 may be disposed on a boundary region B located between the first region I and the second region II. As a result, the second semiconductor chip 200 may overlap a part of the boundary region B and the first region I, and may not overlap the other part of the boundary region B and the second region II.

FIGS. 1 and 2 illustrate a configuration in which a single semiconductor chip is further laminated on the second semiconductor chip 200, but a plurality of semiconductor chips may be further laminated on the second semiconductor chip 200.

In one or more example embodiments, as illustrated in FIGS. 1 and 2, one side surface of the second semiconductor chip 200 on the boundary region B may extend along the first direction X. Therefore, the second region II, the boundary region B, and the first region I may be sequentially arranged along the second direction Y intersecting with the first direction X.

As illustrated in FIG. 3, the boundary region B may have a constant width. Specifically, a first distance D1 which is a distance from one side surface of the second semiconductor chip 200 on the boundary region B to the first region I may be defined. Further, a second distance D2 which is a distance from one side surface of the second semiconductor chip 200 on the boundary region B to the second region II may be defined.

The second semiconductor chip 200 may include a plurality of second chip pads 22. The plurality of second chip pads 22 may be similar to the first chip pads 21 of the first semiconductor chip 100. That is, the second chip pad 22 may electrically connect the second semiconductor chip 200 with the substrate 10 or the second semiconductor chip 200 with another semiconductor chip. Further, the second chip pad 22 may be connected to a circuit element or the like included in the second semiconductor chip 200. As illustrated in FIG. 1, the plurality of second chip pads 22 may be arranged side by side along the first direction X.

The second semiconductor chip 200 may include a second element region 210 and a second attachment region 220. Each of the second element region 210 and the second attachment region 220 may be similar to the first element region 110 and the first attachment region 120. That is, the second element region 210 is a region in which various circuit elements of the second semiconductor chip 200 are aligned. Further, the second attachment region 220 may be a region in which the second semiconductor chip 200 is mounted on another semiconductor chip.

Figure 4:
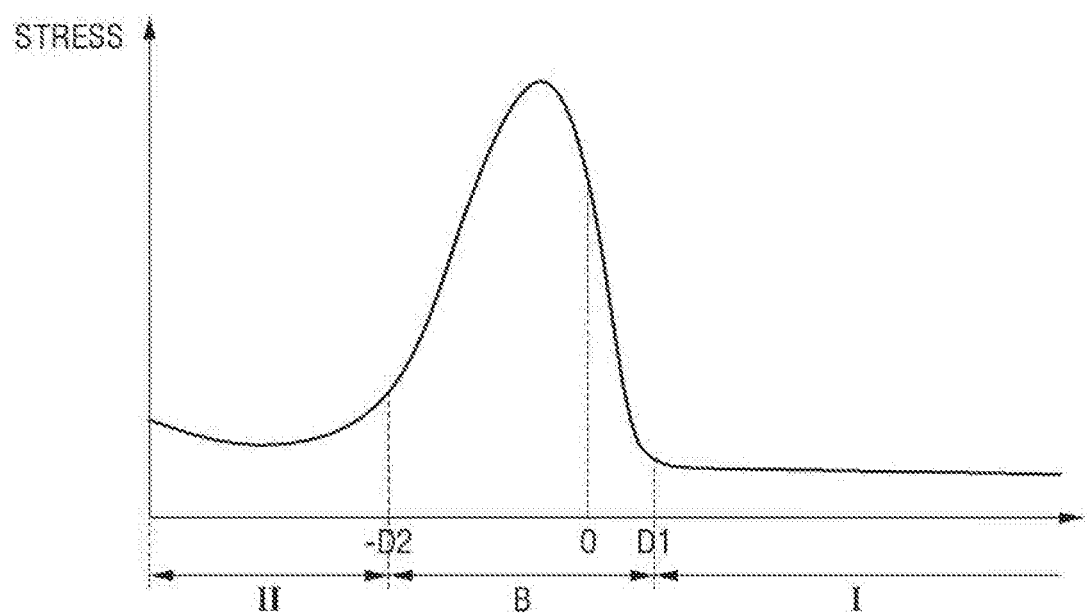
FIG. 4 is a graph illustrating stress applied to the semiconductor chip of FIG. 1.

FIG. 4 is a graph illustrating stress applied to the semiconductor chip of FIG. 1. Specifically, FIG. 4 is a graph illustrating the stress which is applied to the first semiconductor chip 100 when the second semiconductor chip 200 is laminated on the first semiconductor chip 100. A horizontal axis of FIG. 4 represents a distance away from one side surface of the second semiconductor chip 200 on the boundary region B. A vertical axis of FIG. 4 illustrates the magnitude of the stress applied to the first semiconductor chip 100.

Referring to FIG. 4, stress applied to the first semiconductor chip 100 sharply increases in the boundary region B disposed under one side surface of the second semiconductor chip 200. Further, stress applied to the second region II is greater than the stress applied to the first region I.

In the semiconductor package according to one or more example embodiments, the laminated semiconductor chips may be molded, for example, by being surrounded by a molding material. However, because the molding material is made of a material different from that of the semiconductor chip, a difference in thermal expansion coefficients of the molding material and the semiconductor chip may apply stress to the semiconductor chip. The molding material may include an encapsulant such as epoxy molding component (EMC).

For example, when the laminated semiconductor chips form the overhang region, increased stress may be applied to the overhang region directly exposed to the molding material. Thus, the stress applied to the exposed second region II may be greater than the stress applied to the first region I which is covered by the second semiconductor chip 200. Further, such stress may be further concentrated around the boundary of the upper semiconductor chip which forms the overhang region in the lower semiconductor chip. As a result, the stress applied to the first semiconductor chip 100 may sharply increase in the boundary region B disposed under one side surface of the second semiconductor chip 200.

That is, in one or more example embodiments, the boundary region B may be defined as a region of the first semiconductor chip 100 which is located under one side surface of the second semiconductor chip 200 and on which the stress is concentrated. Thus, as illustrated in FIGS. 1 and 2, when one side surface of the second semiconductor chip 200 extends along the first direction X, the boundary region B may extend along the first direction X.

The first distance D1 and the second distance D2 of the boundary region B may change depending on the thickness of the semiconductor chip. For example, when the thickness of the semiconductor chip becomes thinner, the first distance D1 and the second distance D2 may increase. As an example, when the thickness of the first semiconductor chip 100 and the second semiconductor chip 200 is about 100 μm, the first distance D1 may be about 40 μm to about 60 μm, and the second distance D2 may be about 140 μm to about 160 μm. When the thickness of the first semiconductor chip 100 and the second semiconductor chip 200 is smaller than about 100 μm, the first distance D1 and the second distance D2 may be larger than this range. In addition, the first distance D1 and the second distance D2 may differently change, depending on the type of the semiconductor chip, the laminating form of the semiconductor chip, and the like.

Figure 5:
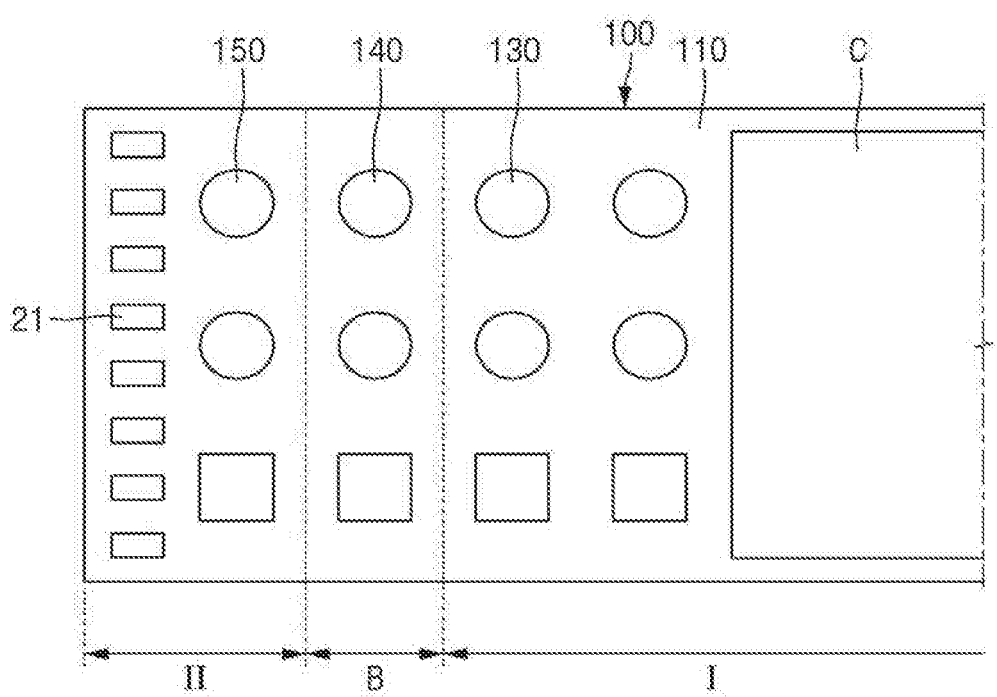
FIG. 5 is a view for schematically explaining the positions of the circuit elements arranged on the first semiconductor chip of FIG. 1.

FIG. 5 is a view for schematically explaining the positions of the circuit elements arranged on the first semiconductor chip of FIG. 1.

Referring to FIG. 5, the first element region 110 includes a memory cell region C, a first circuit element 130, a second circuit element 140, and a third circuit element 150.

The first semiconductor chip 100 may be, for example, a memory semiconductor chip. The memory cell region C and the first circuit element 130 may be disposed in the first region I. When the second semiconductor chip 200 is laminated on the first semiconductor chip 100, the first region I in which the memory cell region C and the first circuit element 130 are disposed may not be exposed.

The memory cell region C may be a region in which a nonvolatile memory is formed. The nonvolatile memory may be, for example, a vertical type NAND flash memory (VNAND) or a flat NAND type flash memory, but example embodiments are not limited thereto.

The first circuit element 130 may be a circuit element mounted in the peripheral circuit region. That is, the first circuit element 130 may be a circuit element necessary for operation of the memory cell region C, and may include various active elements or passive elements. The first circuit element 130 may include, for example, a control logic, an address decoder, an input and output circuit, and the like.

The second circuit element 140 may be disposed in the boundary region B. Similar to the first circuit element 130, the second circuit element 140 may be a circuit element necessary for operation of the memory cell region C.

The stress tolerance of the second circuit element 140 may be greater than the stress tolerance of the first circuit element 130. Here, the stress tolerance means the degree that the circuit element withstands the stress applied from the outside. The stress tolerance may correspond to the strain variation rate of the circuit element. When the circuit element is a transistor, the stress tolerance may also correspond to the drain current (Id) variation rate of the transistor.

The stress tolerance may vary depending on the circuit elements. For example, because the single crystal silicon is vulnerable to stress, a circuit element not including the single crystal silicon may have a higher stress tolerance than that of a circuit element including the single crystal silicon.

For example, the first circuit element 130 may be a circuit element including the single crystal silicon, and the second circuit element 140 may be a circuit element not including the single crystal silicon. For example, the first circuit element 130 may be a transistor, and the second circuit element 140 may be a capacitor, a polysilicon resistor, a metal resistor, a silicide resistor, or the like.

That is, the first circuit element 130 having a low stress tolerance may be disposed in the first region I to which less stress is applied, and the second circuit element 140 having a high stress tolerance may be disposed in the boundary region B to which a large amount of stress is applied.

The third circuit element 150 may be disposed in the second region II. Accordingly, when the second semiconductor chip 200 is laminated on the first semiconductor chip 100, the third circuit element 150 may be exposed to the outside. As with the first circuit element 130, the third circuit element 150 may be a circuit element necessary for operation of the memory cell region C.

The stress tolerance of the third circuit element 150 may be greater than the stress tolerance of the first circuit element 130. In addition, the stress tolerance of the third circuit element 150 may be less than the stress tolerance of the second circuit element 140. However, in one or more example embodiments, the third circuit element 150 may also be omitted.

Due to the laminated structure of the semiconductor chip, the stress applied to the semiconductor chip may affect the characteristics of the circuit elements in the semiconductor chip. As the thickness of the semiconductor chip becomes increasingly thinner, such a problem may become far worse. However, in the semiconductor package according to one or more example embodiments, a circuit element having a low stress tolerance is disposed in a region to which less stress is applied, and the circuit element having a high stress tolerance is disposed in a region to which a large amount of stress is applied. Thus, it is possible to minimize the change in the characteristics of the circuit elements in the semiconductor chip.

Hereinafter, a semiconductor package according to one or more example embodiments will be described with reference to FIGS. 1 to 6, 7a and 7b. For the sake of convenience of explanation, repeated portions of the description using FIGS. 1 to 5 will be briefly described or omitted.

Figure 6:
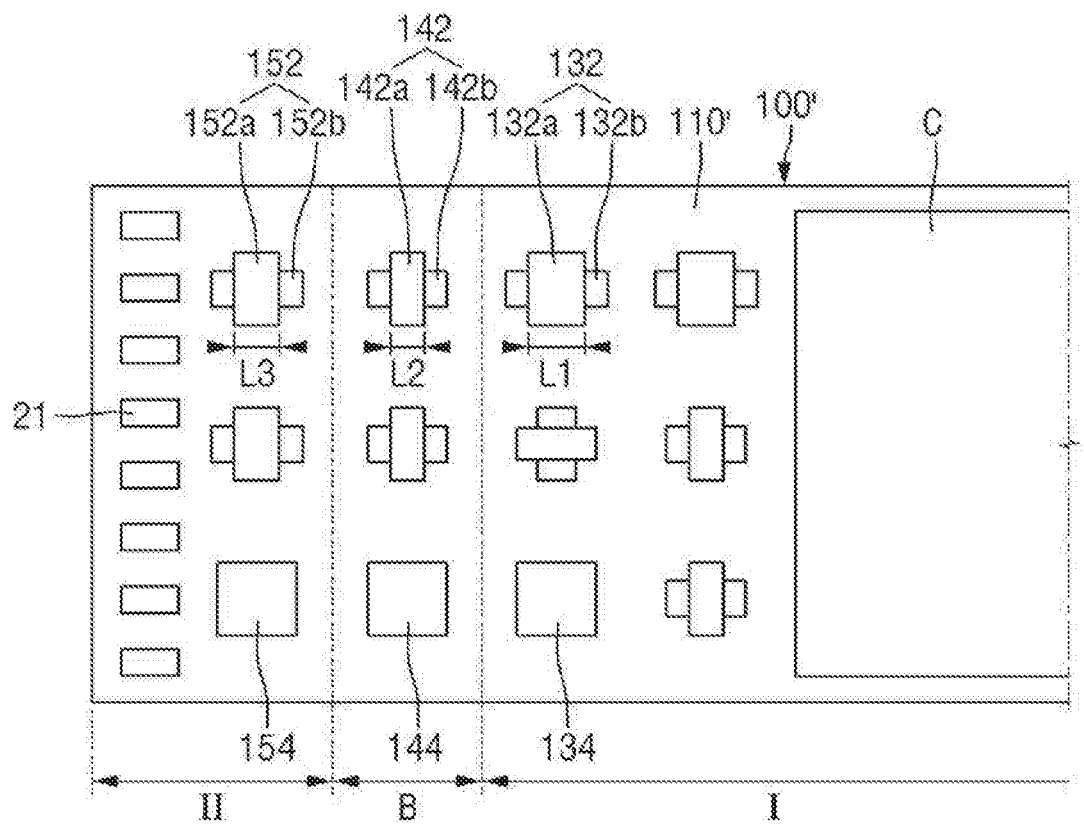
FIG. 6 is a plan view illustrating a circuit element arranged on a semiconductor chip according to one or more example embodiments.

FIG. 6 is a plan view illustrating a circuit element arranged on a semiconductor chip according to one or more example embodiments. FIG. 6 illustrates a case where the circuit elements of FIG. 5 include a transistor.

Referring to FIG. 6, the first element region 110' includes a first transistor 132, a second transistor 142, and a third transistor 152.

The first transistor 132 may be disposed in the first region I. However, various active elements or passive elements other than the first transistor 132 may be disposed in the first region I. For example, another circuit element, such as the first passive element 134, may be disposed in the first region I.

The first transistor 132 may include a first gate 132a, and a first source and drain 132b. The first source and drain 132b may be disposed adjacent to both sides of the first gate 132a. The first transistor 132 may have a channel length of the first length L1.

The second transistor 142 may be disposed in the boundary region B. The second transistor 142 may include a second gate 142a, and a second source and drain 142b. The second source and drain 142b may be disposed adjacent to both sides of the second gate 142a. The second transistor 142 may have a channel length of a second length L2 shorter than the first length L1. As a result, the stress tolerance of the second transistor 142 may be greater than the stress tolerance of the first transistor 132. This will be described later in detail with reference to FIGS. 7a and 7b.

In one or more example embodiments, the second passive element 144 may also be disposed in the boundary region B. The second passive element 144 may be a circuit element that does not include single crystal silicon. For example, the second passive element 144 may include at least one from among a capacitor, a polysilicon resistor, a metal resistor, and a silicide resistor. Thus, the stress tolerance of the second passive element 144 may be greater than the stress tolerance of the first transistor 132.

The third transistor 152 may be disposed in the second region II. The third transistor 152 may include a third gate 152a, and a third source and drain 152b. The third source and drain 152b may be disposed adjacent to both sides of the third gate 152a. The third transistor 152 may have a channel length of a third length L3 shorter than the first length L1. As a result, the stress tolerance of the third transistor 152 may be greater than the stress tolerance of the first transistor 132. Also, the third length L3 may be longer than the second length L2. As a result, the stress tolerance of the third transistor 152 may be less than the stress tolerance of the second transistor 142.

In one or more example embodiments, a third passive element 154 may also be disposed in the second region II. As with the second passive element 144, the third passive element 154 may be a circuit element that does not include the single crystal silicon. For example, the third passive element 154 may include at least one from among a capacitor, a polysilicon resistor, a metal resistor, and a silicide resistor.

However, in one or more example embodiments, the third transistor 152 and the third passive element 154 may also be omitted.

Figure 7A:
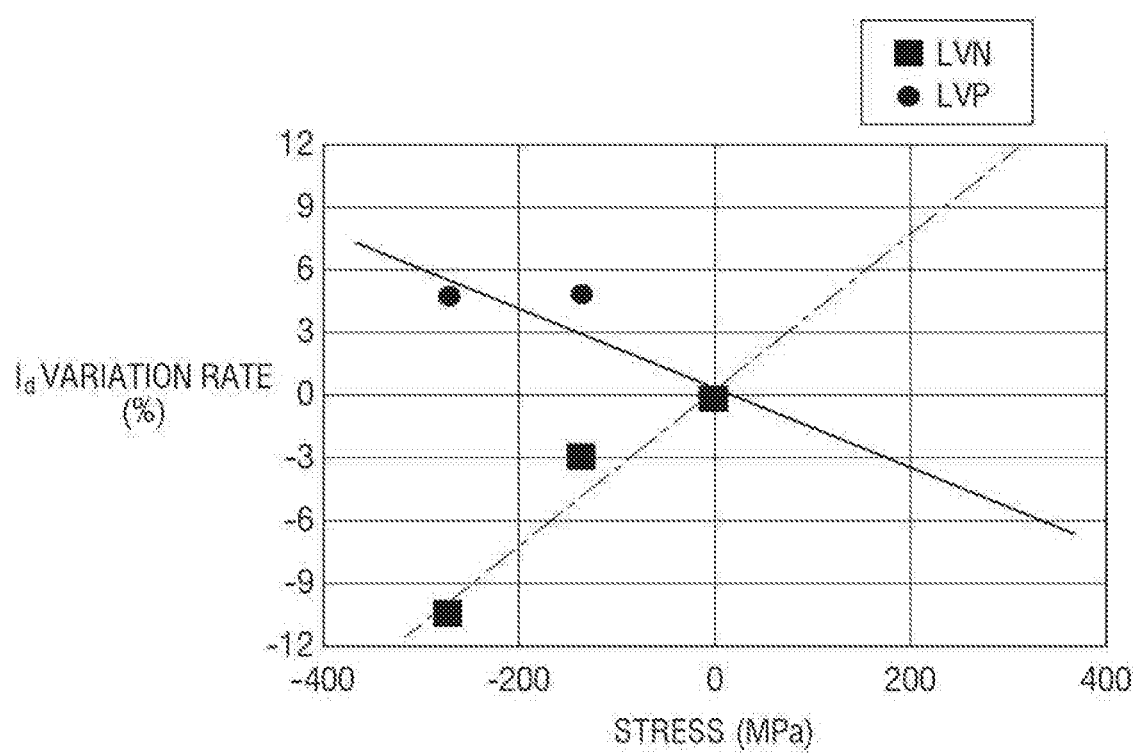
FIGS. 7a and 7b are graphs illustrating characteristics of the circuit element of FIG. 6.
Figure 7B:
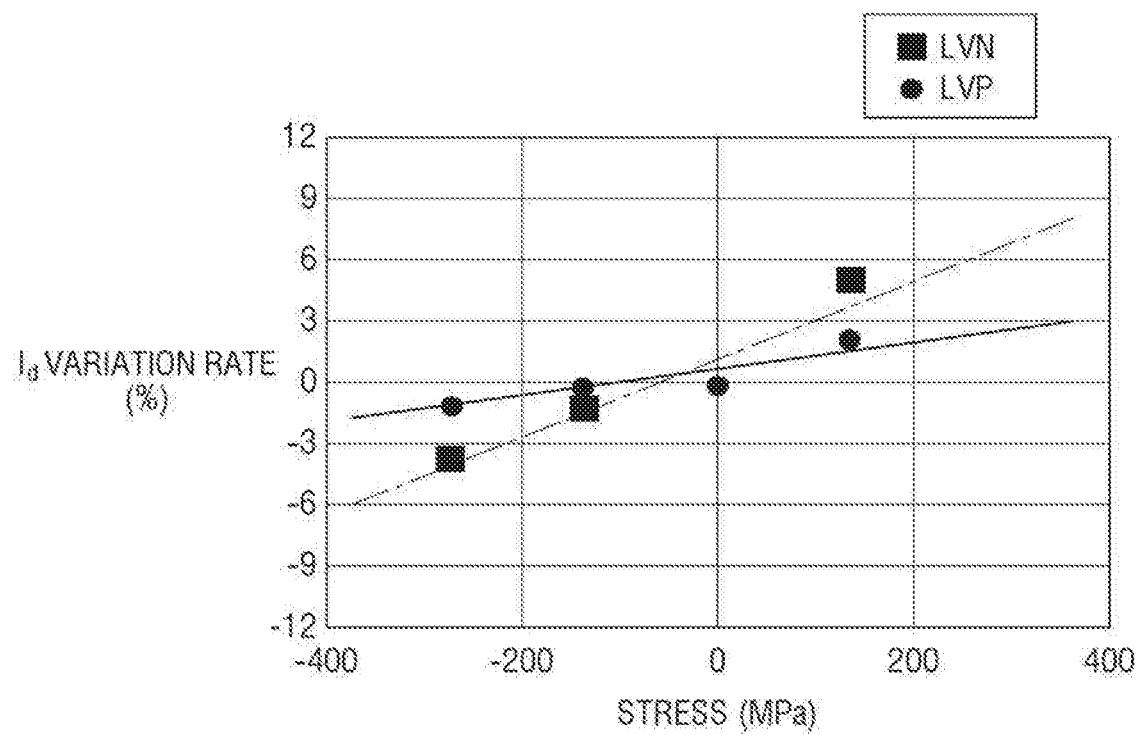

FIGS. 7a and 7b are graphs illustrating characteristics of the circuit element of FIG. 6. FIGS. 7a and 7b illustrate the drain current (Id) variation rate of each transistor according to the stress applied to the transistor. Stress with a positive value means tensile stress, and stress with a negative value means compressive stress.

Specifically, FIG. 7a illustrates drain current variation rates of n-type transistors (e.g., LVN; Low Voltage NFET) and p-type transistors (e.g., LVP; Low Voltage PFET) having a channel length of 10 μm. Further, FIG. 7b illustrates drain current variation rates of the n-type transistor (LVN) and the p-type transistor (LVP) having the channel length of 0.27 μm. That is, the channel length of the transistor of FIG. 7a is longer than the channel length of the transistor of FIG. 7b.

The solid lines of FIGS. 7a and 7b are trend lines illustrating a change rate of the drain current variation rate of the n-type transistor. In addition, the broken lines of FIGS. 7a and 7b are trend lines illustrating a change rate of the drain current variation rate of the p-type transistor.

Referring to FIGS. 7a and 7b, it is possible to understand that a change in the drain current variation rate of the n-type transistor (LVN) of FIG. 7b is smaller than a change in the drain current variation rate of the n-type transistor (LVN) of FIG. 7a. Further, it is possible to understand that the change in the drain current variation rate of the p-type transistor (LVP) of FIG. 7b is smaller than the change in the drain current variation rate of the p-type transistor (LVP) of FIG. 7a. That is, for the same stress, the magnitude of the drain current variation rate of the transistor of FIG. 7b is smaller than the magnitude of the drain current variation rate of the transistor of FIG. 7a.

As described above, the stress tolerance of a transistor may correspond to the drain current variation rate. That is, for the same stress, a transistor with a small drain current variation rate has stress tolerance higher than a transistor with a large drain current variation rate. As a result, the stress tolerance of the transistor with a shorter channel length may be greater than the stress tolerance of the transistor with a longer channel length.

Thus, the second transistor 142 having the channel length of the second length L2 shorter than the first length L1 may have stress tolerance higher than the first transistor 132 having the channel length of the first length L1.

Therefore, in the semiconductor package according to one or more example embodiments, by disposing the circuit element having low stress tolerance in a region to which less stress is applied, and by disposing the circuit element having high stress tolerance in a region to which a large amount of stress is applied, it is possible to minimize the change in the characteristics of the circuit elements in the semiconductor chip.

Hereinafter, the semiconductor package according to one or more example embodiments will be described with reference to FIGS. 1 to 9. For the sake of convenience of explanation, repeated portions of the description using FIGS. 1 to 7b will be briefly described or omitted.

Figure 8:
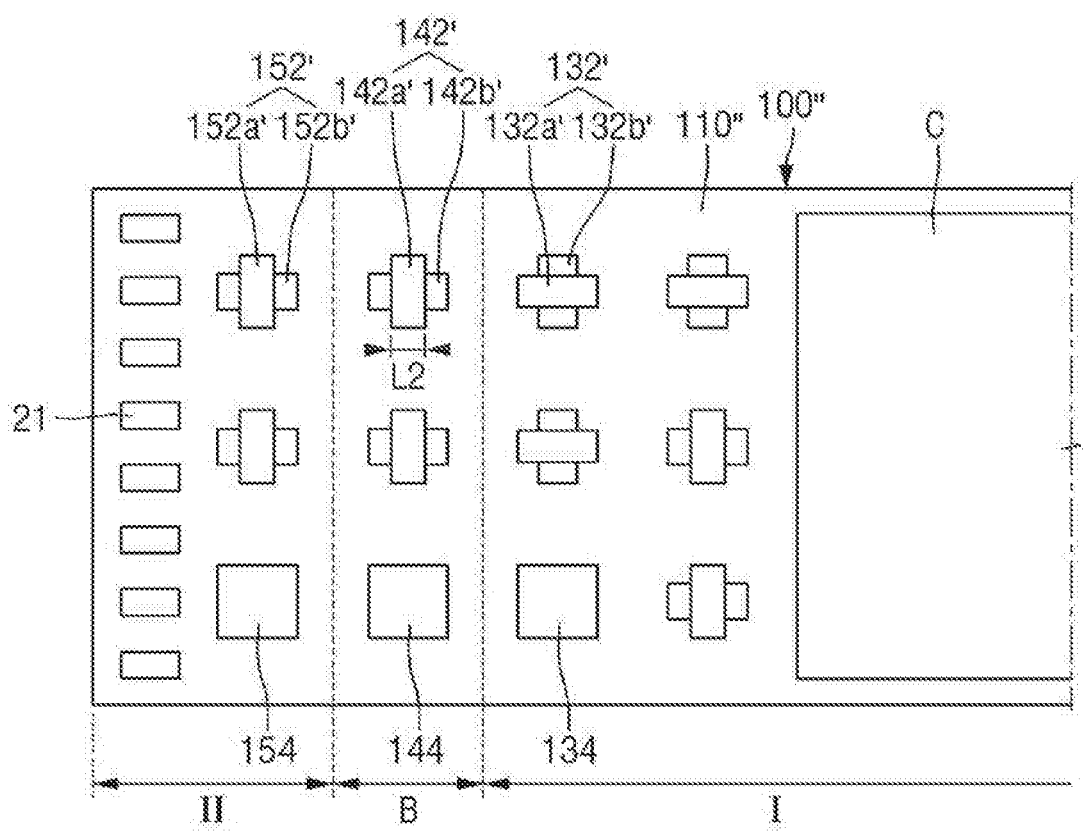
FIG. 8 is a plan view illustrating a circuit element disposed on a semiconductor chip according to one or more example embodiments.

FIG. 8 is a plan view illustrating a circuit element disposed on a semiconductor chip according to one or more example embodiments. Except for the first to third transistors 132', 142', and 152', a first semiconductor chip 100" according to the FIG. 8 is substantially the same as the first semiconductor chip 100' according to FIG. 6. Therefore, the differences will be mainly explained.

Referring to FIG. 8, the first element region 110" includes a first transistor 132', a second transistor 142' and a third transistor 152'. That is, similarly to FIG. 6, FIG. 8 illustrates a case where the circuit elements of FIG. 5 include a transistor.

The first transistor 132' may be disposed in the first region I. The first transistor 132' may include a first gate 132a' and a first source and drain 132b'. The first source and drain 132b' may be disposed adjacent to both sides of the first gate 132a'. The first sources and drains 132b' may be aligned side by side along the first direction X.

The second transistor 142' may be disposed in the boundary region B. The second transistor 142' may include a second gate 142a' and a second source and drain 142b'. The second source and drain 142b' may be disposed adjacent to both sides of the second gate 142a'. The second source and the drain 142b' may be aligned side by side along the second direction Y. As a result, the stress tolerance of the second transistor 142' may be greater than the stress tolerance of the first transistor. This will be described later in detail with reference to FIG. 9.

In one or more example embodiments, the channel length of the second transistor 142' may be shorter than the channel length of the first transistor 132'. For example, the second transistor 142' may have a channel length of a second length L2 that is shorter than the first length L1 which is the channel length of the first transistor (132 of FIG. 6).

The third transistor 152' may be disposed in the second region II. The third transistor 152' may include a third gate 152a' and a third source and drain 152b'. The third source and drain 152b' may be disposed adjacent to both sides of the third gate 152a'. The third source and the drain 152b' may be aligned side by side along the second direction Y. As a result, the stress tolerance of the third transistor 152' may be greater than the stress tolerance of the first transistor.

However, in one or more example embodiments, the third transistor 152' may be omitted.

Figure 9:
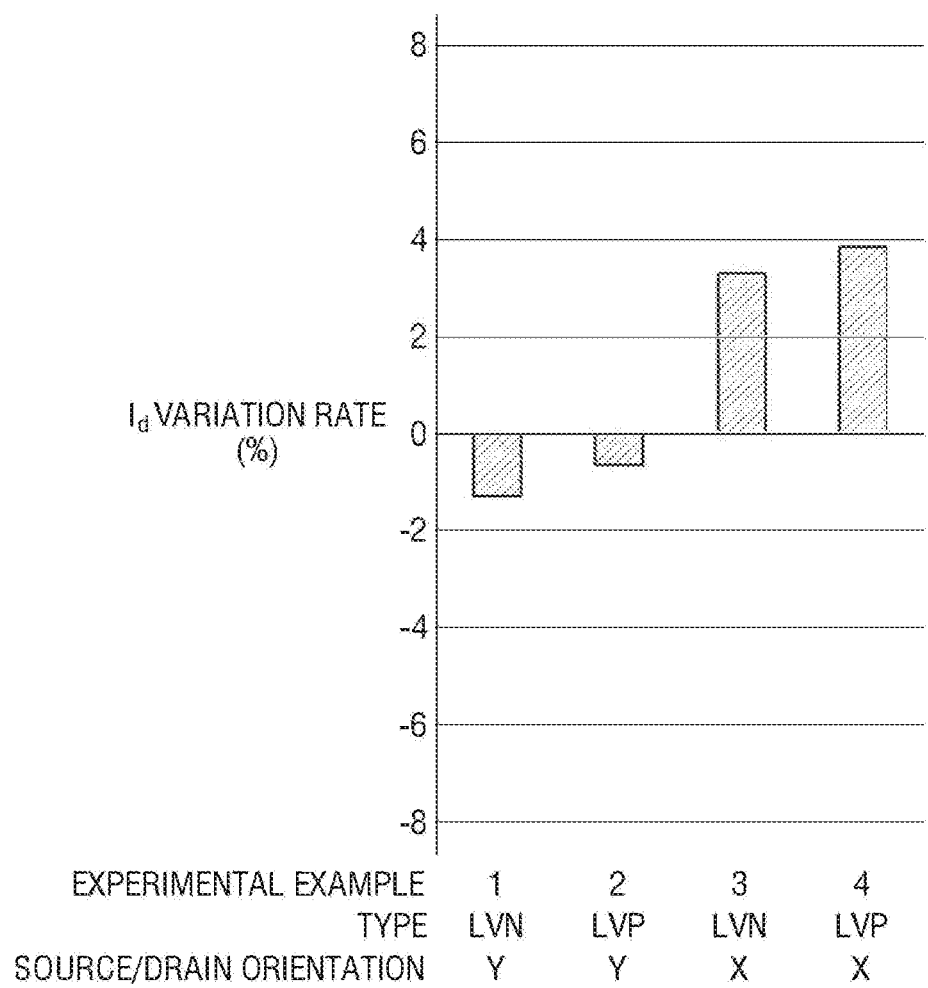
FIG. 9 is a graph illustrating characteristics of the circuit element of FIG. 8.

FIG. 9 is a graph illustrating characteristics of the circuit element of FIG. 8. FIG. 9 illustrates the drain current variation rates of various transistors. FIG. 9 illustrates a measurement result of the drain current variation rates of the transistors having the channel length of 0.27 μm when a compressive stress of 200 megapascal (MPa) is applied.

Experimental example 1 illustrates the drain current variation rate of the n-type transistor (LVN) in which the sources and drains are aligned along the second direction Y. Experimental example 2 illustrates the drain current variation rate of the p-type transistor (LVP) in which the sources and drains are aligned along the second direction Y. Experimental example 3 illustrates the drain current variation rate of the n-type transistor (LVN) in which the sources and drains are aligned along the first direction X. Experimental example 4 illustrates the drain current variation rate of the p-type transistor (LVP) in which the sources and drains are aligned along the first direction X.

Here, the first direction X is a direction in which the boundary region B defined in the first semiconductor chip 100" extends. Also, the second direction Y is a direction intersecting with the first direction X. For example, the second direction Y may be perpendicular to the first direction X. In FIG. 9, the second direction Y is a direction of the transistors having the sources and drains aligned in a direction perpendicular to the first direction X.

Referring to FIG. 9, the magnitude of the drain current variation rate of the transistor in which the sources and drains are aligned along the second direction Y is smaller than the magnitude of the drain current variation rate of the transistor in which the sources and drains are aligned along the first direction X. Specifically, when comparing Experimental Example 1 with Experimental Example 3, the magnitude of the drain current variation rate of Experimental Example 1 in which the sources and drains are aligned along the second direction Y is smaller than the magnitude of the drain current variation rate of Experimental Example 3 in which the sources and drains are aligned along the first direction X. Further, when comparing Experimental Example 2 with Experimental Example 4, the magnitude of the drain current variation rate of Experimental Example 2 in which the sources and drains are aligned along the second direction Y is smaller than the magnitude of the drain current variation rate of Experimental Example 4 in which the sources and drains are aligned along the first direction X.

As described above, the stress tolerance of a transistor may correspond to the drain current variation rate. That is, for the same stress, a transistor with a small drain current variation rate has higher stress tolerance than a transistor with a large drain current variation rate. Consequentially, the stress tolerance of the transistor in which the sources and drains are aligned in the direction perpendicular to the direction in which the boundary region B extends may be greater than the stress tolerance of the transistor in which the sources and drains are aligned in the direction in which the boundary region B extends.

Thus, the stress tolerance of the second transistor 142' in which the second source and the drain 142b' are aligned in the second direction Y is greater than the stress tolerance of the first transistor 132' in which the first sources and drains 132b' are aligned in the first direction X.

Based on a design, the orientation of the first sources and drains 132b' may be adjusted. That is, the second transistor 142' having the large stress tolerance may be disposed in the boundary region B to which a large amount of stress is applied, and the orientations of the first sources and drains 132b' may be adjusted.

Therefore, in the semiconductor package according to one or more example embodiments, by disposing a circuit element having the high stress tolerance in a region to which high stress is applied, it is possible to minimize a change in the characteristics of the circuit element in the semiconductor chip.

Hereinafter, a method for fabricating the semiconductor package according to one or more example embodiments will be described with reference to FIGS. 1 and 10 to 14. For the sake of convenience of explanation, repeated portions of the description using FIGS. 1 to 9 will be briefly described or omitted.

Figure 10:
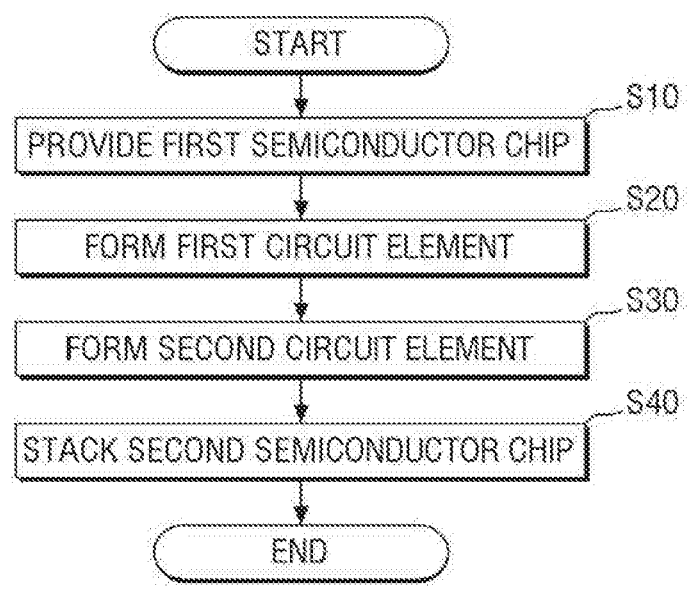
FIG. 10 is a flowchart illustrating a method for fabricating the semiconductor package according to one or more example embodiments.

FIG. 10 is a flowchart illustrating a method for fabricating the semiconductor package according to one or more example embodiments. FIGS. 11 to 14 are intermediate step diagrams illustrating the method for fabricating the semiconductor package according to FIG. 10.

Figure 11:
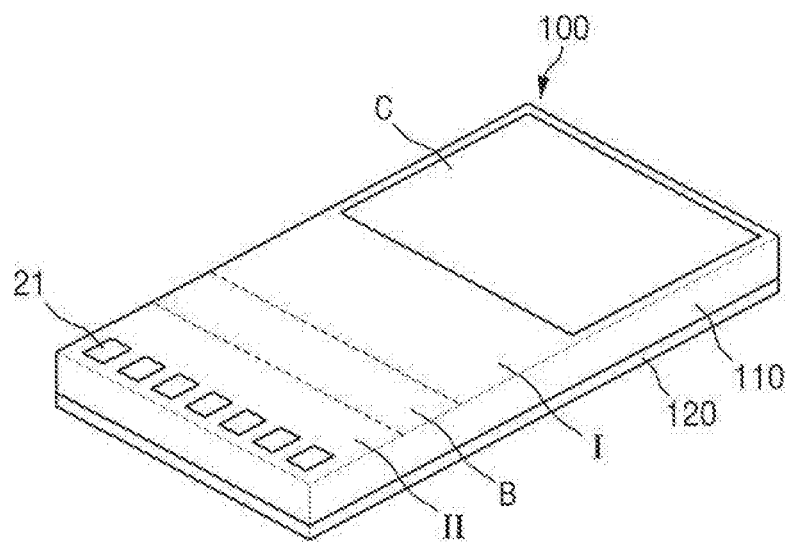
FIGS. 11 to 14 are intermediate step diagrams illustrating the method for fabricating the semiconductor package according to FIG. 10.

Referring to FIGS. 10 and 11, a first semiconductor chip 100 is provided (S10).

Providing the first semiconductor chip 100 may include defining the first region I, the second region II, and the boundary region B. Specifically, the position of the second semiconductor chip (200 of FIG. 1) to be laminated on the first semiconductor chip 100 may be specified in advance. For example, as illustrated in FIG. 1, the position of the second semiconductor chip 200 which is laminated stepwise on the first semiconductor chip 100 to form the overhang region may be specified in advance.

As a result, the stress applied to the first semiconductor chip 100 by the second semiconductor chip 200 may be analyzed to define the first region I, the second region II, and the boundary region B. Specifically, the region of the first semiconductor chip 100, which is disposed under one side surface of the second semiconductor chip 200 and on which the stress is concentrated, may be defined as the boundary region B. Further, a region which is adjacent to the boundary region B and overlaps the second semiconductor chip 200 may be defined as the first region I. Further, a region which is adjacent to the boundary region B and does not overlap the second semiconductor chip 200 may be defined as the second region II.

Figure 12:
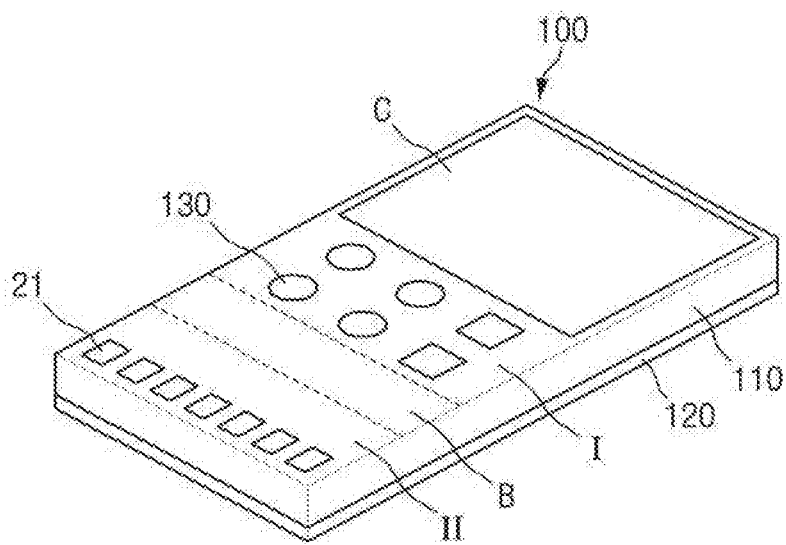

Referring to FIGS. 10 and 12, a first circuit element 130 is formed in the first region I (S20).

Formation of the first circuit element 130 includes formation of a circuit element having low stress tolerance. For example, the first circuit element 130 may be a circuit element including single crystal silicon. Also, for example, the first circuit element 130 may be a transistor having a relatively long channel length.

Figure 13:
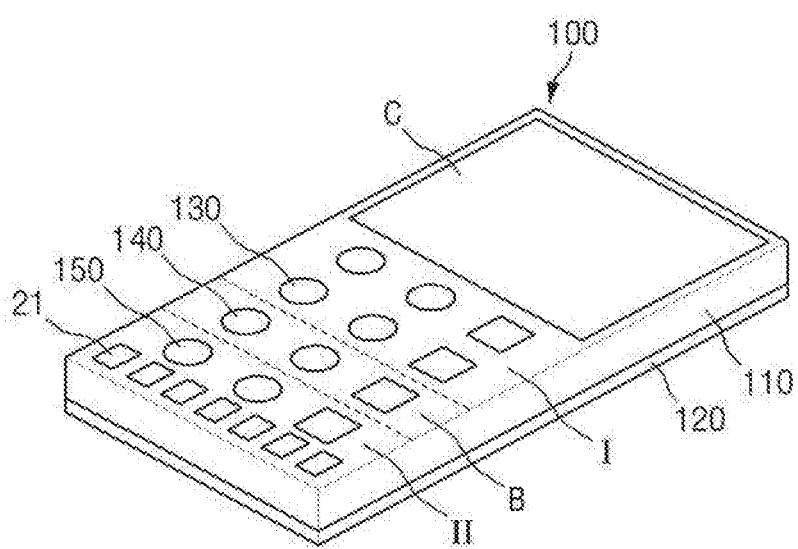

Referring to FIGS. 10 and 13, the second circuit element 140 is formed in the boundary region B (S30).

The stress tolerance of the second circuit element 140 may be greater than the stress tolerance of the first circuit element 130. For example, the second circuit element 140 may be a circuit element that does not include single crystal silicon. Also, for example, the second circuit element 140 may be a transistor having a relatively short channel length. In addition, for example, the second circuit element 140 may be a transistor in which the sources and drains are aligned in a direction perpendicular to a direction in which the boundary region B extends.

The second circuit element 140 has been described as being formed after the first circuit element 130, but example embodiments are not limited thereto. For example, the second circuit element 140 may be formed before the first circuit element 130. Also, the second circuit element 140 may be formed, simultaneously with the first circuit element 130.

Figure 14:
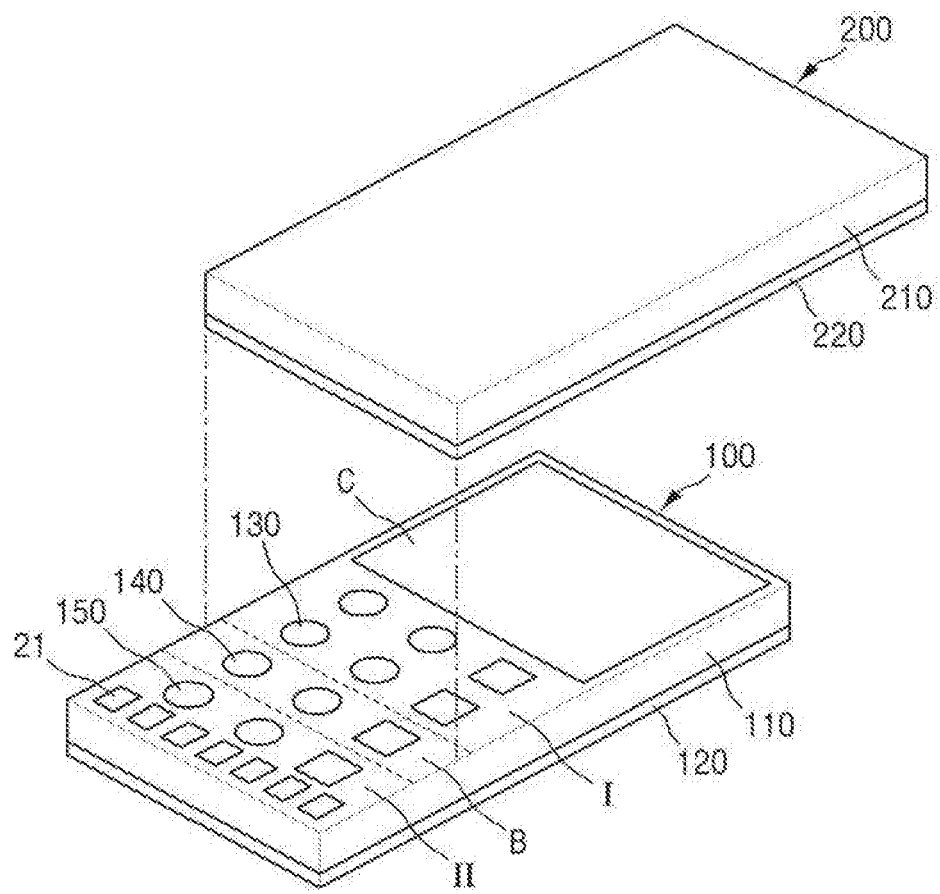

Referring to FIGS. 10 and 14, a second semiconductor chip 200 is laminated on the first semiconductor chip 100 (S40). Therefore, the semiconductor package according to FIG. 1 can be fabricated.

Specifically, the second semiconductor chip 200 may be laminated on the first semiconductor chip 100 so as to overlap the first region I and not overlap the second region II. One side surface of the second semiconductor chip 200 may be disposed on the boundary region B. As a result, the second semiconductor chip 200 may overlap a part of the boundary region B and the first region I, and may not overlap the other part of the boundary region B and the second region II.

Therefore, in the method for fabricating the semiconductor package according to one or more example embodiments, a circuit element having low stress tolerance is disposed in a region to which less stress is applied, and a circuit element having a high stress tolerance is disposed in a region to which a large amount of stress is applied. Thus, it is possible to minimize the change in the characteristics of the circuit elements in the semiconductor chip.

Figure 15:
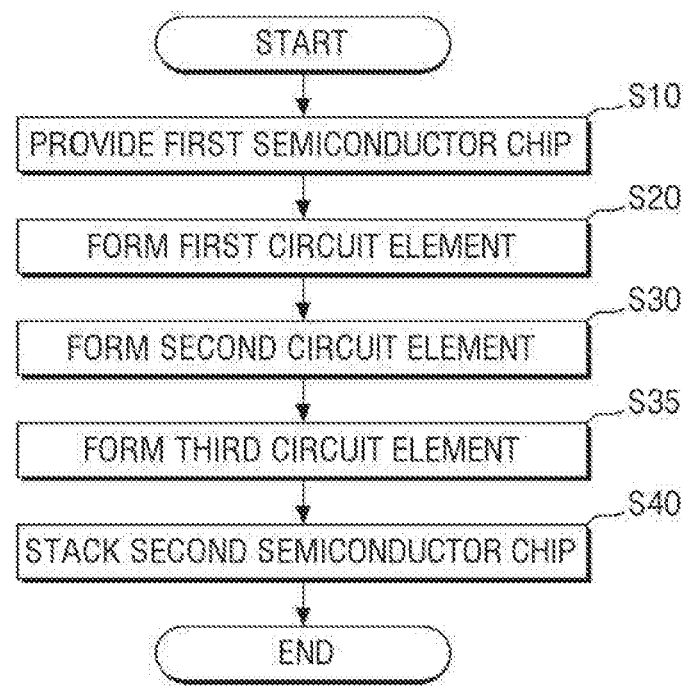
FIG. 15 is a flowchart illustrating a method for fabricating a semiconductor package according to one or more example embodiments.

Hereinafter, with reference to FIG. 15, a method for fabricating a semiconductor package according to one or more example embodiments will be described. The method for fabricating the semiconductor package according to FIG. 15 is substantially similar to the method discussed above with reference to FIG. 10, except that the former further includes forming a third circuit element 150. Therefore, the differences will be mainly explained.

FIG. 15 is a flowchart illustrating the method for fabricating the semiconductor package according to one or more example embodiments.

Referring to FIG. 15, the third circuit element 150 is formed in the second region II (S35).

The stress tolerance of the third circuit element 150 may be greater than the stress tolerance of the first circuit element 130. Further, the stress tolerance of the third circuit element 150 may be less than the stress tolerance of the second circuit element 140.

The third circuit element 150 has been described as being formed after forming the first circuit element 130 and the second circuit element 140, but example embodiments are not limited thereto. For example, the third circuit element 150 may be formed before the first circuit element 130 or the second circuit element 140. Also, the third circuit element 150 may be formed simultaneously with the first circuit element 130 or the second circuit element 140.

Figure 16:
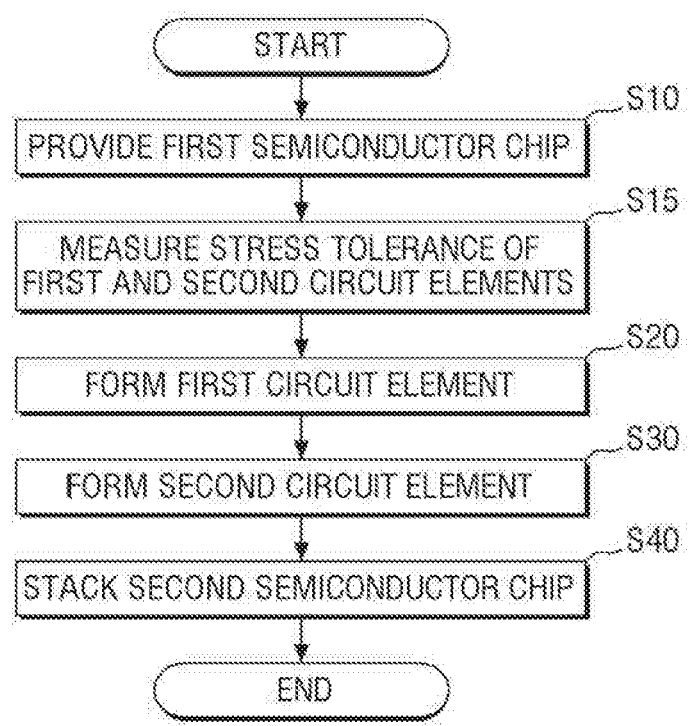
FIG. 16 is a flowchart illustrating a method for fabricating a semiconductor package according to one or more example embodiments.

Hereinafter, with reference to FIG. 16, a method for fabricating a semiconductor package according to one or more example embodiments will be described. The method for fabricating a semiconductor package according to FIG. 16 is substantially similar to the method for fabricating the semiconductor package discussed above with reference to FIG. 10 except that the former further includes measuring the stress tolerance of the first circuit element 130 and the second circuit element 140. Therefore, the differences will be mainly explained.

FIG. 16 is a flowchart illustrating a method for fabricating a semiconductor package according to one or more example embodiments.

Referring to FIG. 16, before forming the first circuit element 130 and the second circuit element 140, the stress tolerances of the first circuit element 130 and the second circuit element 140 are evaluated, respectively (S15).

For example, it is possible to evaluate the stress tolerances of various circuit elements to be formed, before forming the circuit elements on the first semiconductor chip 100. Therefore, a circuit element having the low stress tolerance may be defined as the first circuit element 130. Further, a circuit element having the high stress tolerance may be defined as the second circuit element 140. For example, a circuit element including single crystal silicon may be defined as the first circuit element 130, and a circuit element not including single crystal silicon may be defined as the second circuit element 140.

When the first circuit element 130 and the second circuit element 140 include a transistor, evaluation of the stress tolerance of the first circuit element 130 and the second circuit element 140 may include measurement of the drain current variation rate of the first circuit element 130 and the second circuit element 140. Thus, a transistor with the large drain current variation rate may be defined as the first circuit element 130, and a transistor with the small drain current variation rate may be defined as the second circuit element 140.

For example, a transistor having a relatively long channel length may be defined as the first circuit element 130, and a transistor having a relatively short channel length may be defined as the second circuit element 140. Further, for example, a transistor in which the sources and drains are aligned in a direction in which the boundary region B extends may be defined as the first circuit element 130, and a transistor, in which the sources and drains are aligned in the direction perpendicular to a direction in which the boundary region B extends, may be defined as the second circuit element 140.

While aspects of example embodiments have been particularly illustrated and described, it will be understood by those of ordinary skill in the art that various changes in form and detail may be made therein without departing from the spirit and scope of the present disclosure as defined by the following claims. The example embodiments described above should be considered in a descriptive sense only and not for purposes of limitation.

What is claimed is:

1. A semiconductor package comprising:
a first semiconductor chip which comprises a first region, a second region, and a boundary region between the first region and the second region; and
a second semiconductor chip disposed on the first semiconductor chip, wherein the second semiconductor chip is overlapping the first region and a part of the boundary region, and not overlapping the second region,
wherein a plurality of first transistors are disposed in the boundary region,
wherein a plurality of second transistors are disposed in the first region,
wherein first sources and drains of the plurality of first transistors are aligned in the same direction as each other, and
wherein second sources and drains of the plurality of second transistors are aligned in different directions.

2. The semiconductor package of claim 1, wherein a plurality of third transistors are disposed in the second region, and
wherein third sources and drains of the plurality of third transistors are aligned in different directions.

3. The semiconductor package of claim 1, wherein a first stress tolerance of each of the plurality of first transistors is greater than a second stress tolerance of each of the plurality of second transistors.

4. The semiconductor package of claim 3, wherein a circuit element is disposed in the second region,
wherein a third stress tolerance of the circuit element is greater than the second stress tolerance, and
wherein the third stress tolerance of the circuit element is less than the first stress tolerance.

5. The semiconductor package of claim 1, wherein a first distance from a first side surface of the second semiconductor chip on the boundary region to the first region is 40 µm to 60 µm, and
wherein a second distance from the first side surface of the second semiconductor chip on the boundary region to the second region is 140 µm to 160 µm.

6. The semiconductor package of claim 1, wherein a stress applied to the second region is greater than a stress applied to the first region.

7. The semiconductor package of claim 1, wherein one side surface of the second semiconductor chip on the boundary region extends along a first direction, and
wherein the first sources and drains of each of the plurality of first transistors are aligned along a second direction that intersects the first direction.

8. The semiconductor package of claim 1, wherein a first channel length of each of the plurality of first transistors is shorter than a second channel length of each of the plurality of second transistors.

9. A semiconductor package comprising:
a first semiconductor chip which comprises a first region, a second region, and a boundary region between the first region and the second region; and
a second semiconductor chip disposed on the first semiconductor chip, wherein the second semiconductor chip is overlapping the first region and a part of the boundary region, and not overlapping the second region,
wherein a plurality of first transistors are disposed in the second region,
wherein a plurality of second transistors are disposed in the first region,
wherein first sources and drains of the plurality of first transistors are aligned in the same direction as each other, and
wherein second sources and drains of the plurality of second transistors are aligned in different directions.

10. The semiconductor package of claim 9, wherein a circuit element is disposed in the boundary region, and
wherein a first stress tolerance of the circuit element is greater than a second stress tolerance of each of the plurality of second transistors.

11. The semiconductor package of claim 10, wherein a third stress tolerance of each of the plurality of first transistors is greater than the second stress tolerance, and
wherein the first stress tolerance of the circuit element is greater than the third stress tolerance.

12. The semiconductor package of claim 9, wherein a first distance from a first side surface of the second semiconductor chip on the boundary region to the first region is 40 μm to 60 μm, and
wherein a second distance from the first side surface of the second semiconductor chip on the boundary region to the second region is 140 μm to 160 μm.

13. The semiconductor package of claim 9, wherein a stress applied to the second region is greater than a stress applied to the first region.

14. The semiconductor package of claim 9, wherein one side surface of the second semiconductor chip on the boundary region extends along a first direction, and
wherein the first sources and drains of each of the plurality of first transistors are aligned along a second direction that intersects the first direction.

15. The semiconductor package of claim 9, wherein a first channel length of each of the plurality of first transistors is shorter than a second channel length of each of the plurality of second transistors.

16. A semiconductor package comprising:
a first semiconductor chip which comprises a first region, a second region, and a boundary region between the first region and the second region; and
a second semiconductor chip disposed on the first semiconductor chip, wherein the second semiconductor chip is overlapping the first region and a part of the boundary region, and not overlapping the second region,
wherein a first circuit element is disposed in the first region, a second circuit element is disposed in the boundary region, and a third circuit element is disposed in the second region,
wherein the first circuit element comprises an active element, and
wherein third circuit element stress tolerance is greater than first circuit element stress tolerance and is less than second circuit element stress tolerance.

17. The semiconductor package of claim 16, wherein a stress applied to the second region is greater than a stress applied to the first region.

18. The semiconductor package of claim 16, wherein the first circuit element includes a plurality of first transistors,
wherein the second circuit element includes a plurality of second transistors,
wherein the third circuit element includes a plurality of third transistors,
wherein first sources and drains of the plurality of first transistors are aligned in a different directions,
wherein second sources and drains of the plurality of second transistors are aligned in the same direction as each other, and
wherein third sources and drains of the plurality of third transistors are aligned in the same direction as each other.

19. The semiconductor package of claim 16, wherein a first distance from a first side surface of the second semiconductor chip on the boundary region to the first region is 40 μm to 60 μm, and
wherein a second distance from the first side surface of the second semiconductor chip on the boundary region to the second region is 140 μm to 160 μm.

20. The semiconductor package of claim 16, wherein the second circuit element includes a plurality of transistors,
wherein one side surface of the second semiconductor chip on the boundary region extends along a first direction, and
wherein sources and drains of each of the plurality of transistors are aligned along a second direction that intersects the first direction.

* * * * *